US012628280B2

(12) United States Patent (10) Patent No.: US 12,628,280 B2
Watanabe et al. (45) Date of Patent: May 12, 2026

(54) ASSEMBLY SHEET

(71) Applicant: NITTO DENKO CORPORATION, Osaka (JP)

(72) Inventors: Chihiro Watanabe, Osaka (JP); Kenya Takimoto, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 226 days.

(21) Appl. No.: 18/404,458

(22) Filed: Jan. 4, 2024

(65) Prior Publication Data

US 2024/0244756 A1 Jul. 18, 2024

(30) Foreign Application Priority Data

Jan. 17, 2023 (JP) ................................. 2023-005403

(51) Int. Cl.
H05K 3/00 (2006.01)
H05K 1/02 (2006.01)
(52) U.S. Cl.
CPC ......... H05K 3/0097 (2013.01); H05K 1/0266 (2013.01); H05K 2201/09936 (2013.01); H05K 2203/0165 (2013.01)
(58) Field of Classification Search
CPC ................ H05K 3/0097; H05K 1/026; H05K 2201/09936; H05K 1/0266
See application file for complete search history.

(56) References Cited

U.S. PATENT DOCUMENTS

| | | | | |
|---|---|---|---|---|
| 5,027,505 A | * | 7/1991 | Nakamura | ................ G09F 3/00 361/792 |
| 6,891,108 B2 | * | 5/2005 | Prindiville | .............. H01L 24/97 174/255 |
| 2002/0015129 A1 | * | 2/2002 | Hasegawa | .............. H05K 3/361 349/149 |
| 2007/0241764 A1 | | 10/2007 | Naito et al. | |
| 2011/0058347 A1 | | 3/2011 | Ihara et al. | |

FOREIGN PATENT DOCUMENTS

| | | |
|---|---|---|
| JP | 2007-287799 A | 11/2007 |
| JP | 2010-258189 A | 11/2010 |
| JP | 2011-060925 A | 3/2011 |

* cited by examiner

*Primary Examiner* — Timothy J Thompson
*Assistant Examiner* — John B Freal
(74) *Attorney, Agent, or Firm* — Edwards Neils LLC; Jean C. Edwards, Esq.

(57) ABSTRACT

An assembly sheet includes a supporting portion, a plurality of wiring circuit boards, and a joint portion. The supporting portion supports the plurality of wiring circuit boards. The supporting portion surrounds the plurality of wiring circuit boards while being separated from the plurality of wiring circuit boards by an interval. The joint portion joins the plurality of wiring circuit boards to the supporting portion. The plurality of wiring circuit boards includes a first wiring circuit board and a second wiring circuit board. The second wiring circuit board is arranged next to the first wiring circuit board while being separated from the first wiring circuit board by an interval. The second wiring circuit board is symmetrical to the first wiring circuit board with respect to a point centered therebetween. The supporting portion includes a first and second mark. The second mark is asymmetrical to the first with respect to the point.

7 Claims, 12 Drawing Sheets

1

1

1

1

1

One side

↑ Thickness
  direction
↓

The other side

One side

Thickness
direction

The other side

25    BC

BC   25

11

1,2

1

ASSEMBLY SHEET

CROSS-REFERENCE TO RELATED APPLICATION

The present application claims priority from Japanese Patent Application No. 2023-5403 filed on Jan. 17, 2023, the contents of which are hereby incorporated by reference into this application.

TECHNICAL FIELD

The present invention relates to an assembly sheet.

BACKGROUND ART

There has been a known assembly sheet including a plurality of wiring circuit boards, a supporting portion, and a joint portion (for example, see Patent Document 1 below).

In the assembly sheet described in Patent Document 1, the supporting portion supports the plurality of wiring circuit boards. The supporting portion surrounds the plurality of wiring circuit boards. The plurality of wiring circuit boards includes a first wiring circuit board and a second wiring circuit board. The second wiring circuit board is symmetrical to the first wiring circuit board with respect to a point centered therebetween.

The supporting portion includes a first mark and a second mark. The second mark is symmetrical to the first mark with respect to the above-described point. Based on the differentiation between the first mark and the second mark, the first wiring circuit board and the second wiring circuit board are distinguished from each other.

CITATION LIST

Patent Document

Patent Document 1: Japanese Unexamined Patent Publication No. 2010-258189

SUMMARY OF THE INVENTION

Problem to be Solved by the Invention

The assembly sheet may be rotated around the above-described point. In such a case, the second mark is point symmetrical to the first mark, and thus the first and second marks cannot be distinguished from each other. A disadvantage of the above is thus that the first wiring circuit board and the second wiring circuit board cannot surely be distinguished from each other.

The present invention provides an assembly sheet of which first wiring circuit board and second wiring circuit board are faultlessly distinguished from each other.

Means for Solving the Problem

The present invention [1] includes an assembly sheet including: a plurality of wiring circuit boards; a supporting portion supporting the plurality of wiring circuit boards and surrounding the plurality of wiring circuit boards while being separated from the plurality of wiring circuit boards by an interval; and a joint portion joining the plurality of wiring circuit boards to the supporting portion, wherein the plurality of wiring circuit boards includes a first wiring circuit board and a second wiring circuit board arranged adjacent to the first wiring circuit board while being separated from the first wiring circuit board by an interval and being symmetrical to the first wiring circuit board with respect to a point centered therebetween, and wherein the supporting portion includes a first mark and a second mark being asymmetrical to the first mark with respect to the point.

In the assembly sheet, the second mark is asymmetrical to the first mark with respect to the above-described point. Thus, even when the assembly sheet is rotated around the above-described point, the first mark and the second mark are distinguished from each other. As a result, based on the differentiation between the first mark and the second mark, the first wiring circuit board and the second wiring circuit board can faultlessly be distinguished from each other.

The present invention [2] includes the assembly sheet described in the above-described [1], wherein the first mark is disposed in a one-side part of the supporting portion in an arrangement direction in which the first and second circuit boards are arranged, and wherein the second mark is disposed in the one-side part of the supporting portion in the arrangement direction.

The present invention [3] includes the assembly sheet described in the above-described [1], wherein the first mark is disposed in a one-side part of the supporting portion in an arrangement direction in which the first and second circuit boards are arranged, and wherein the second mark is disposed in the other-side part of the supporting portion in the arrangement direction.

The present invention [4] includes the assembly sheet described in any one of the above-described [1] to [3], wherein the first wiring circuit board includes a first main body portion and a first protruding portion protruding from the first main body portion toward the second wiring circuit board, wherein the second wiring circuit board includes a second main body portion and a second protruding portion protruding from the second main body portion toward the first wiring circuit board, and wherein the first protruding portion and the second protruding portion are adjacent to each other in a direction intersecting with the thickness direction and an arrangement direction in which the first and second circuit boards are arranged.

In the assembly, the first protruding portion and the second protruding portion are next to each other in a direction intersecting with the thickness direction and the arrangement direction, and thus the first wiring circuit board and the second wiring circuit board are compactly disposed in the arrangement direction. Thus, the number of wiring circuit boards on one assembly sheet can be increased.

The present invention [5] includes the assembly sheet described in the above-described [1], wherein the supporting portion includes a metal supporting layer, an insulating base layer, and a conductive layer in this order toward one side in the thickness direction, and wherein each of the first mark and the second mark includes a conductive mark included in the conductive layer.

The present invention [6] includes the assembly sheet described in the above-described [1], wherein the supporting portion includes a metal supporting layer, and wherein each of the first mark and the second mark includes a metal penetrating hole included in the metal supporting layer.

The present invention [7] includes the assembly sheet described in the above-described [1], wherein the supporting portion includes a metal supporting layer, and wherein each of the first mark and the second mark includes a barcode formed on a one-side surface or the other-side surface of the metal supporting layer in the thickness direction.

Effects of the Invention

In the assembly sheet of the present invention, the first wiring circuit board and the second wiring circuit board can faultlessly be distinguished from each other.

BRIEF DESCRIPTION OF THE DRAWINGS

FIG. 10 is a cross-sectional view of the barcode of FIG. 9, taken along line X-X.

DESCRIPTION OF THE EMBODIMENT

1. One Embodiment of Assembly Sheet

Figure 1:
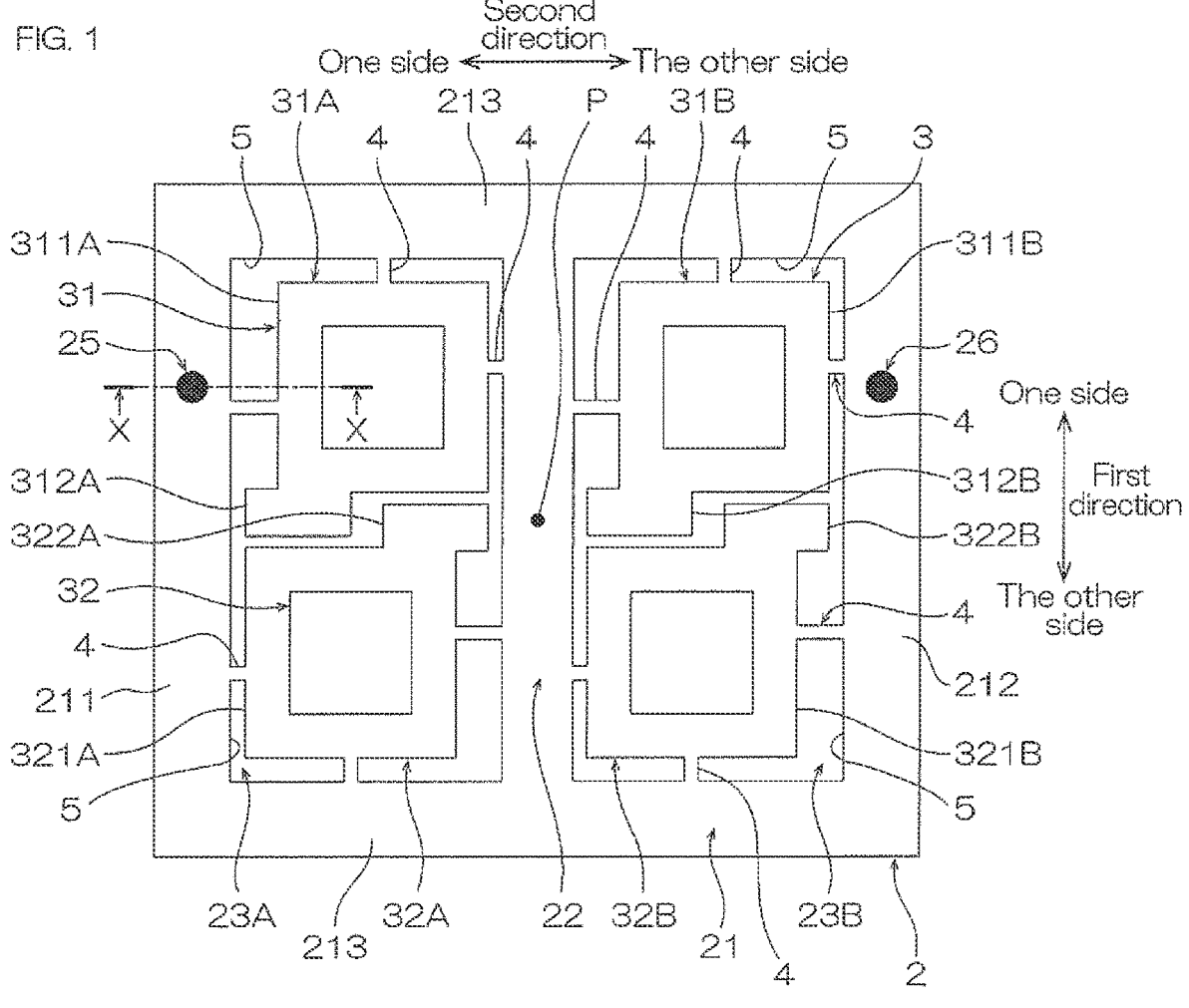
FIG. 1 is a plan view of one embodiment of the assembly sheet of the present invention.
Figure 2:
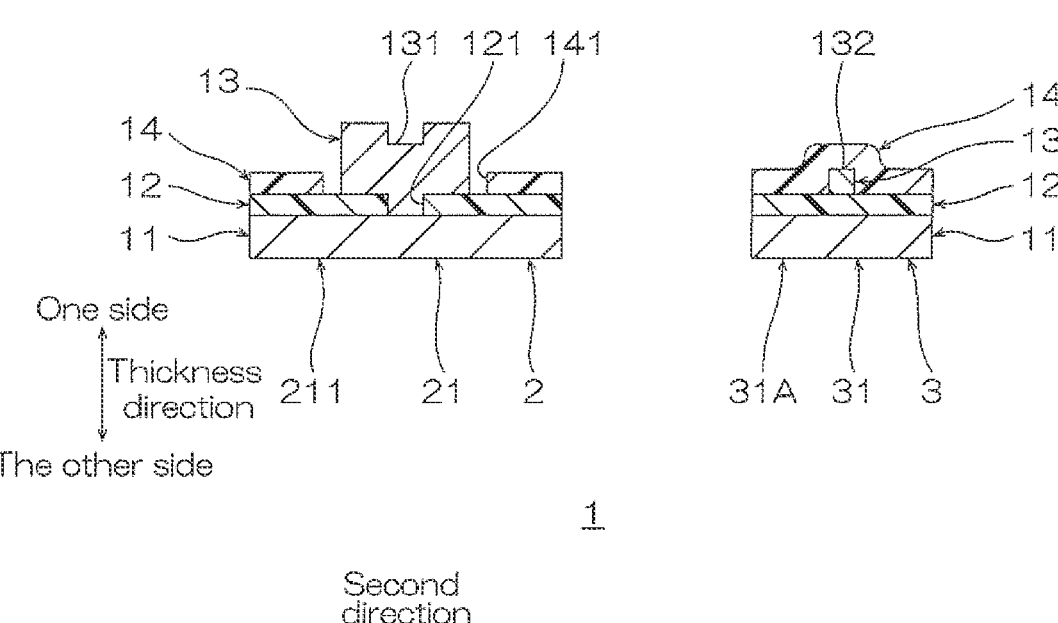
FIG. 2 is a cross-sectional view of the assembly sheet of FIG. 1, taken along line X-X.
Figure 3:
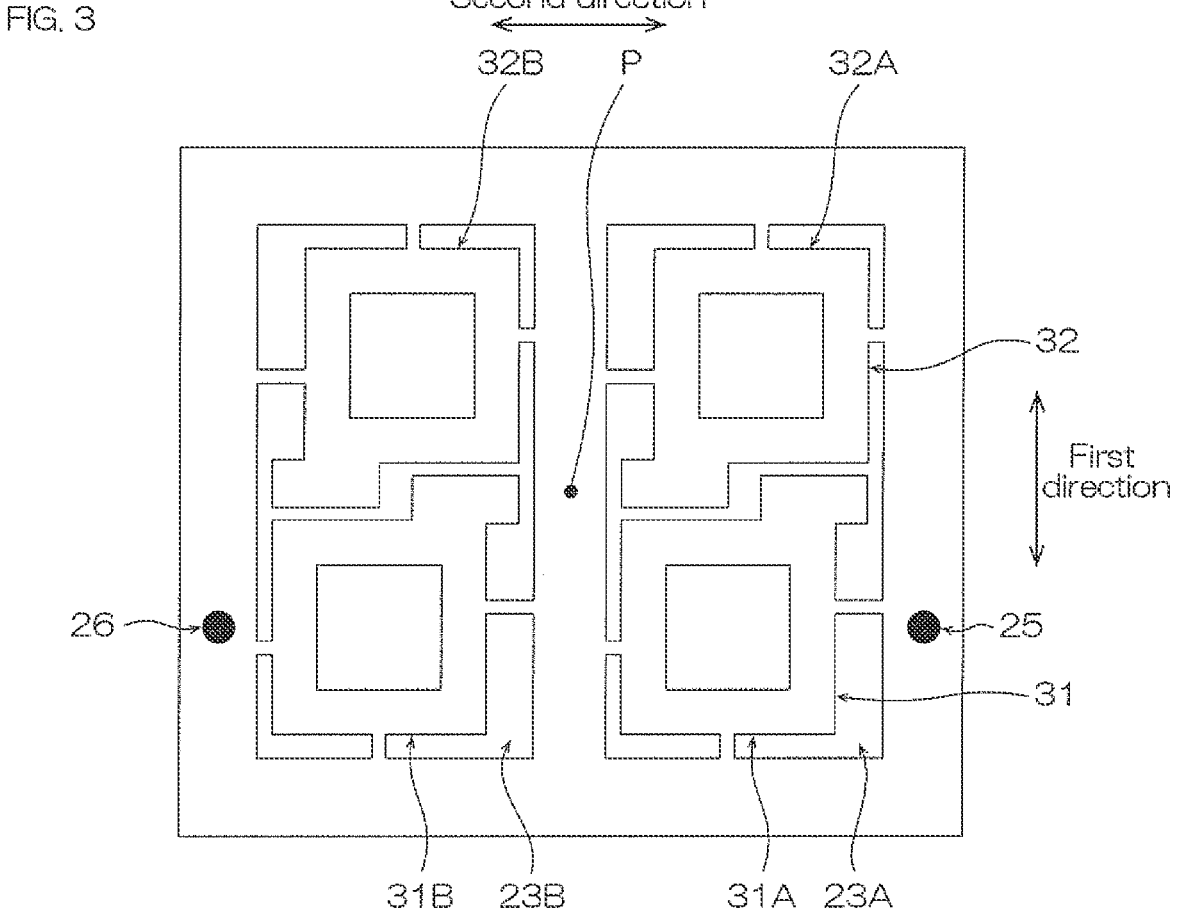
FIG. 3 illustrates a state in which the assembly sheet of FIG. 1 is rotated by 180 degrees.

With reference to FIGS. 1 to 3, one embodiment of the assembly sheet of the present invention is described.

As illustrated in FIG. 2, an assembly sheet 1 has a thickness. As illustrated in FIG. 1, the assembly sheet 1 extends in a surface direction. The surface direction is orthogonal to the thickness direction of the assembly sheet 1. In the present embodiment, the assembly sheet 1 has, for example, a rectangular shape. In the present embodiment, the assembly sheet 1 has point symmetry about a point P. When being projected in the thickness direction, the point P is located inside the assembly sheet 1. For example, the point P is located at the center of the assembly sheet 1. The center is the center of the assembly sheet 1 in a first direction and the center of the assembly sheet 1 in a second direction. The assembly sheet 1 includes a supporting portion 2, a plurality of wiring circuit boards 3, and a joint portion 4.

1.1 Supporting Portion 2

In the present embodiment, the supporting portion 2 forms the outer shape of the assembly sheet 1. The supporting portion 2 supports the plurality of wiring circuit boards 3 described next. In the present embodiment, the supporting portion 2 has point symmetry about the above-described point P. The supporting portion 2 includes a frame 21 and a rail portion 22.

The frame 21 is disposed on a peripheral end portion of the supporting portion 2. The frame 21 has an approximately rectangular frame shape in the plan view. The frame 21 includes a first portion 211, a second portion 212, and two third portions 213.

The first portion 211 extends in the first direction. The first portion 211 is disposed in a one end portion of the frame 21 in the second direction. The second direction is orthogonal to the thickness direction and the first direction. The first direction and the second direction are included in the surface direction. In the present embodiment, the first portion 211 has the shape of a straight line.

The second portion 212 extends in the first direction. The second portion 212 is disposed in the other end portion of the frame 21 in the second direction. The second portion 212 is separated from the first portion 211 by an interval in the second direction. In the present embodiment, the second portion 212 has the shape of a straight line.

The third portions 213 are disposed in both end portions of the frame 21 in the first direction. The third portions 213 joins the one end portion of the first portion 211 to the one end portion of the second portion 212 in the first direction and the other end portion of the first portion 211 with the other end portion of the second portion 212 in the first direction, respectively. In the present embodiment, the two third portions 213 each have the shape of a straight line.

The rail portion 22 is disposed between the first portion 211 and the second portion 212 in the second direction. The rail portion 22 forms a bridge between the two third portions 213. The rail portion 22 extends in the first direction. In the present embodiment, the rail portion 22 has the shape of a straight line. The rail portion 22 divides an internal region of the frame 21 into a plurality of parts. In the present embodiment, the rail portion 22 divides the internal region of the frame 21 into two. The rail portion 22 divides the internal region of the frame 21 into a first region 23A and a second region 23B. The first region 23A and the second region 23B are arranged side by side in the second direction. The second region 23B is disposed at a side opposite to the first region 23A relative to the rail portion 22 in the second direction.

1.2 Wiring Circuit Boards 3

The wiring circuit boards 3 are arrayed while being separated from each other by an interval. The plurality of wiring circuit boards 3 is surrounded by the supporting portion 2. The plurality of wiring circuit boards 3 is separated from the supporting portion 2 by an interval. In other words, the supporting portion 2 surrounds the plurality of wiring circuit boards 3 while being separated from them by an interval.

In the present embodiment, the plurality of wiring circuit boards 3 includes a plurality of first wiring circuit boards 31 and a plurality of second wiring circuit boards 32. The first wiring circuit boards 31 are arranged side by side in the second direction. The second wiring circuit boards 32 are arranged side by side in the second direction. In the present embodiment, the plurality of first wiring circuit boards 31 includes a first wiring circuit board 31A and a first wiring circuit board 31B. In the present embodiment, the plurality of second wiring circuit boards 32 includes a second wiring circuit board 32A and a second wiring circuit board 32B.

1.2.1 First Wiring Circuit Board 31A

The first wiring circuit board 31A (a first main body portion 311A described below) is disposed in a one-side part of the first region 23A in the first direction.

1.2.2 First Wiring Circuit Board 31B

The first wiring circuit board 31B (a first main body portion 311B described below) is disposed in a one-side part of the second region 23B in the first direction. The first wiring circuit board 31B is arranged next to the first wiring circuit board 31A in the second direction. The first wiring circuit board 31B is disposed at a side opposite to the first wiring circuit board 31A relative to the rail portion 22 in the second direction. The whole of the first wiring circuit board 31B overlaps with the whole of the first wiring circuit board 31A when being projected in the second direction.

1.2.3 Second Wiring Circuit Board 32A

The second wiring circuit board 32A (a second main body portion 321A described below) is disposed in the other-side part of the first region 23A in the first direction. The second wiring circuit board 32A is disposed next to the first wiring circuit board 31A in the first direction while being separated from the first wiring circuit board 31A by an interval.

The second wiring circuit board 32A is point symmetrical to the first wiring circuit board 31B with respect to the point P centered therebetween.

1.2.4 Second Wiring Circuit Board 32B

The second wiring circuit board 32B (a second main body portion 321B described below) is disposed in the other-side part of the second region 23B in the first direction. The second wiring circuit board 32B is arranged next to the second wiring circuit board 32A in the second direction. The second wiring circuit board 32B is disposed at a side opposite to the second wiring circuit board 32A relative to the rail portion 22 in the second direction. The whole of the second wiring circuit board 32B overlaps with the whole of the second wiring circuit board 32A when being projected in the second direction. The second wiring circuit board 32B is arranged next to the first wiring circuit board 31B in the first direction while being separated from the first wiring circuit board 31B by an interval.

The second wiring circuit board 32B is point symmetrical to the first wiring circuit board 31A with respect to the point P centered therebetween.

Accordingly, the second wiring circuit boards 32 (the second wiring circuit boards 32B and 32A) are symmetrical to the first wiring circuit boards 31 (the first wiring circuit boards 31A and 31B) with respect to the point P centered therebetween. The first wiring circuit board 31A, the first wiring circuit board 31B, the second wiring circuit board 32B, and the second wiring circuit board 32A are disposed in a clockwise direction around the point P.

1.3 Joint Portion 4

The joint portion 4 joins the supporting portion 2 to the plurality of wiring circuit boards 3. Although not illustrated, the joint portion 4 may join the first wiring circuit board 31A to the second wiring circuit board 32A. The joint portion 4 may join the first wiring circuit board 31B to the second wiring circuit board 32B.

1.4 Opening Portion

The assembly sheet 1 may further include an opening portion 5. The opening portion 5 is disposed between the supporting portion 2 and the wiring circuit boards 3. Further, the opening portion 5 is disposed between the first wiring circuit board 31A and the second wiring circuit board 32A. The opening portion 5 is disposed between the first wiring circuit board 31B and the second wiring circuit board 32B. In the present embodiment, the opening portion 5 is a slit penetrating the assembly sheet 1 in the thickness direction. The opening portion 5 defines the outer shape of each of the wiring circuit boards 3.

1.5 Details of First Wiring Circuit Boards 31A and 31B, Second Wiring Circuit Boards 32A and 32B, and Supporting Portion 2

The first wiring circuit boards 31A and 31B, the second wiring circuit boards 32A and 32B, and the supporting portion 2 are described in detail in this order.

1.5.1 Details of First Wiring Circuit Boards 31A and 31B

The first wiring circuit board 31A includes a first main body portion 311A and a first protruding portion 312A. The first main body portion 311A has an approximately rectangular frame shape. The first protruding portion 312A protrudes from the first main body portion 311A toward the second wiring circuit board 32A. The first protruding portion 312A protrudes from a one end portion of the first main body portion 311A in the second direction. The first protruding portion 312A extends in the second direction. Further, the first protruding portion 312A protrudes toward the first portion 211 in the second direction. In the present embodiment, the first protruding portion 312A has an approximately rectangular shape.

The first wiring circuit board 31B include a first main body portion 311B and a first protruding portion 312B. The first main body portion 311B has an approximately rectangular frame shape. The first protruding portion 312B protrudes from the first main body portion 311B toward the second wiring circuit board 32B. The first protruding portion 312B extends in the second direction. Further, the first protruding portion 312B protrudes toward the rail portion 22 in the second direction. Furthermore, in the present embodiment, the first protruding portion 312B has an approximately rectangular shape.

1.5.2 Details of the Second Wiring Circuit Boards 32A and 32B

The second wiring circuit board 32A includes a second main body portion 321A and a second protruding portion 322A. The second main body portion 321A has an approximately rectangular frame shape. The second protruding portion 322A protrudes from the second main body portion 321A toward the first wiring circuit board 31A. The second protruding portion 322A extends in the second direction. Further, the second protruding portion 322A protrudes toward the rail portion 22 in the second direction. In the present embodiment, the second protruding portion 322A has an approximately rectangular shape. The first protruding portion 312A and the second protruding portion 322A are next to each other in a direction intersecting with the thickness direction and an arrangement direction in which the first wiring circuit boards and the second wiring circuit boards are arranged. Specifically, the first protruding portion 312A and the second protruding portion 322A are next to each other in the second direction.

The second wiring circuit board 32B includes a second main body portion 321B and a second protruding portion 322B. The second main body portion 321B has an approximately rectangular frame shape. The second protruding portion 322B protrudes from the second main body portion 321B toward the first wiring circuit board 31B. The second protruding portion 322B extends in the second direction. Further, the second protruding portion 322B protrudes toward the second portion 212 in the second direction. Furthermore, in the present embodiment, the second protruding portion 322B has an approximately rectangular shape. The first protruding portion 312B and the second protruding portion 322B are next to each other in the direction intersecting with the thickness direction and the arrangement direction. Specifically, the first protruding portion 312B and the second protruding portion 322B are next each other in the second direction.

1.5.3 Details of Supporting Portion 2

The supporting portion 2 includes a first mark 25 and a second mark 26.

1.6 First Mark 25

The first mark 25 is disposed in the first portion 211 of the supporting portion 2. The first mark 25 is disposed in a one-side part of the first portion 211 in the first direction. In other words, the first mark 25 is disposed in a one-side part of the supporting portion 2 in the arrangement direction. In the present embodiment, the first mark 25 is adjacent to the first wiring circuit board 31A. In the present embodiment, the first mark 25 has an approximately circular shape in the plan view. The first mark 25 may have an approximately rectangular shape in the plan view.

1.7 Second Mark 26

The second mark 26 is disposed in the second portion 212 of the supporting portion 2. The second mark 26 is disposed in the one-side part of the supporting portion 2 in the arrangement direction. Thus, the second mark 26 is asymmetrical to the first mark 25 with respect to the point P centered therebetween. In the present embodiment, the second mark 26 is adjacent to the first wiring circuit board 31B. In the present embodiment, the second mark 26 has the same shape as that of the first mark 25. Specifically, the second mark 26 has an approximately circular shape in the plan view.

The second mark 26 may have a shape different from that of the first mark 25. For example, the first mark 25 has a circular shape while the second mark 26 has a rectangular shape.

1.8 Layer Structure of Assembly Sheet 1

As illustrated in FIG. 2, the assembly sheet 1 includes a metal supporting layer 11, an insulating base layer 12, a conductive layer 13, and an insulating cover layer 14 in this order in the thickness direction.

1.8.1 Metal Supporting Layer 11

The metal supporting layer 11 is located in the other end portion of the assembly sheet 1 in the thickness direction. The metal supporting layer 11 forms an outer shape of the assembly sheet 1. The metal supporting layer 11 is included in each of the supporting portion 2, the wiring circuit boards 3, and the joint portion 4 (not illustrated in FIG. 2). Examples of the material of the metal supporting layer 11 include metal. Examples of the metal include a stainless steel and a copper alloy. The metal has stiffness. The metal supporting layer 11 has thickness of, for example, 15 μm or more, preferably 100 μm or more, and, for example, 500 μm or less, preferably 250 μm or less.

1.8.2 Insulating Base Layer 12

The insulating base layer 12 is disposed on a one-side surface of the metal supporting layer 11 in the thickness direction. The insulating base layer 12 is included in, for example, each of the supporting portion 2 and the wiring circuit boards 3. The insulating base layer 12 has a base penetrating hole 121 in the supporting portion 2. The base penetrating hole 121 is larger than each of the first mark 25 and the second mark 26 and surrounds each of the first mark 25 and the second mark 26. Examples of the material of the insulating base layer 12 include resin, and polyimide is preferably used. The resin has flexibility. The insulating base layer 12 has a thickness of, for example, 1 μm or more, preferably 5 μm or more, and, for example, 25 μm or less, preferably 15 μm or less.

1.8.3 Conductive Layer 13

The conductive layer 13 is disposed on a one-side surface of the insulating base layer 12 in the thickness direction. Further, the conductive layer 13 may be disposed on the one-side surface of the metal supporting layer 11 in the thickness direction. The conductive layer 13 is a single layer or multiple layers. The conductive layer 13 is included in each of the supporting portion 2 and the wiring circuit boards 3.

The conductive layer 13 includes a conductive mark 131 in the supporting portion 2. The conductive mark 131 is in contact with the one-side surface of the metal supporting layer 11 in the thickness direction through the base penetrating hole 121. Each of the first mark 25 and the second mark 26 includes the above-described conductive mark 131.

In the wiring circuit boards 3, the conductive layer 13 includes a wire 132 and a terminal (not illustrated).

1.8.4 Insulating Cover Layer 14

The insulating cover layer 14 is disposed on the one-side surface of the insulating base layer 12 in the thickness direction. The insulating cover layer 14 is included in each of the supporting portion 2 and the wiring circuit boards 3.

In the supporting portion 2, the insulating cover layer 14 surrounds the conductive mark 131 while being separated from the conductive mark 131 by an interval. Further, in the supporting portion 2, the insulating cover layer 14 includes a cover penetrating hole 141. The conductive mark 131 is disposed inside the cover penetrating hole 141 when being projected in the thickness direction.

In the wiring circuit boards 3, the insulating cover layer 14 covers the wire 132 and exposes the terminal (not illustrated).

Examples of the material of the insulating cover layer 14 include resin, and polyimide is preferably used. The resin has flexibility. The insulating cover layer 14 has a thickness of, for example, 1 μm or more, preferably 5 μm or more, and, for example, 25 μm or less, preferably 15 μm or less.

As described above, the supporting portion 2 includes the metal supporting layer 11, the insulating base layer 12, the conductive layer 13, and the insulating cover layer 14 in this order toward one side in the thickness direction. Each of the wiring circuit boards 3 includes the metal supporting layer 11, the insulating base layer 12, the conductive layer 13, and the insulating cover layer 14 in this order toward one side in the thickness direction. The joint portion 4 includes the metal supporting layer 11. In the present embodiment, the joint portion 4 does not include the insulating base layer 12, the conductive layer 13, and the insulating cover layer 14.

1.9 Method of Producing Assembly Sheet 1

To produce the assembly sheet 1, a metal plate not illustrated is prepared. Next, at one side of the metal plate in the thickness direction, an insulating base layer 12, a conductive layer 13, and an insulating cover layer 14 are formed in this order. Subsequently, the outer shape of the metal plate is processed to form a metal supporting layer 11.

2. Operations and Effects

As illustrated in FIG. 1, in the assembly sheet 1, the second mark 26 is asymmetrical to the first mark 25 with respect to the point P centered therebetween. Thus, even when the assembly sheet 1 is rotated around the point P as illustrated in FIG. 3, the first mark 25 and the second mark 26 are distinguished from each other. As a result, based on the differentiation between the first mark 25 and the second mark 26, the first wiring circuit boards 31 (31A and 31B) and the second wiring circuit boards 32 (32A and 32B) are faultlessly distinguished from each other.

Specifically, even when the assembly sheet 1 illustrated in FIG. 1 is rotated by 180 degrees as illustrated in FIG. 3, the operator can distinguish the first mark 25 and second mark 26, which are asymmetrical to each other. This allows the operator to identify the first wiring circuit board 31A adjacent to the first mark 25 and the first wiring circuit board 31B adjacent to the second mark 26. Based on the differentiation of the first wiring circuit board 31A, the operator can identify the second wiring circuit board 32A located in the first region 23A and arranged next to the first wiring circuit board 31A. Based on the differentiation of the second wiring circuit board 32A, the operator can identify the second wiring circuit board 32B located in the second region 23B and arranged next to the first wiring circuit board 31B.

As illustrated in FIG. 1, in the assembly sheet 1 described above, the first protruding portions 312A and 312B are next to the second protruding portions 322A and 322B, respectively, in the direction intersecting with the thickness direction and the arrangement direction. Thus, the first wiring circuit boards 31 (31A and 31B) and the second wiring circuit boards 32 (32A and 32B) are compactly disposed in the arrangement direction. Therefore, the number of the wiring circuit boards 3 in one assembly sheet 1 can be increased.

3. Variations

In each of the variations described below, the same members and steps as the above-described one embodiment are given the same numerical references and the descriptions thereof are omitted. Further, each of the variations has the same operations and effects as those of one embodiment unless especially described otherwise. One embodiment and its variations can appropriately be combined.

3.1 First Variation

Figure 4:
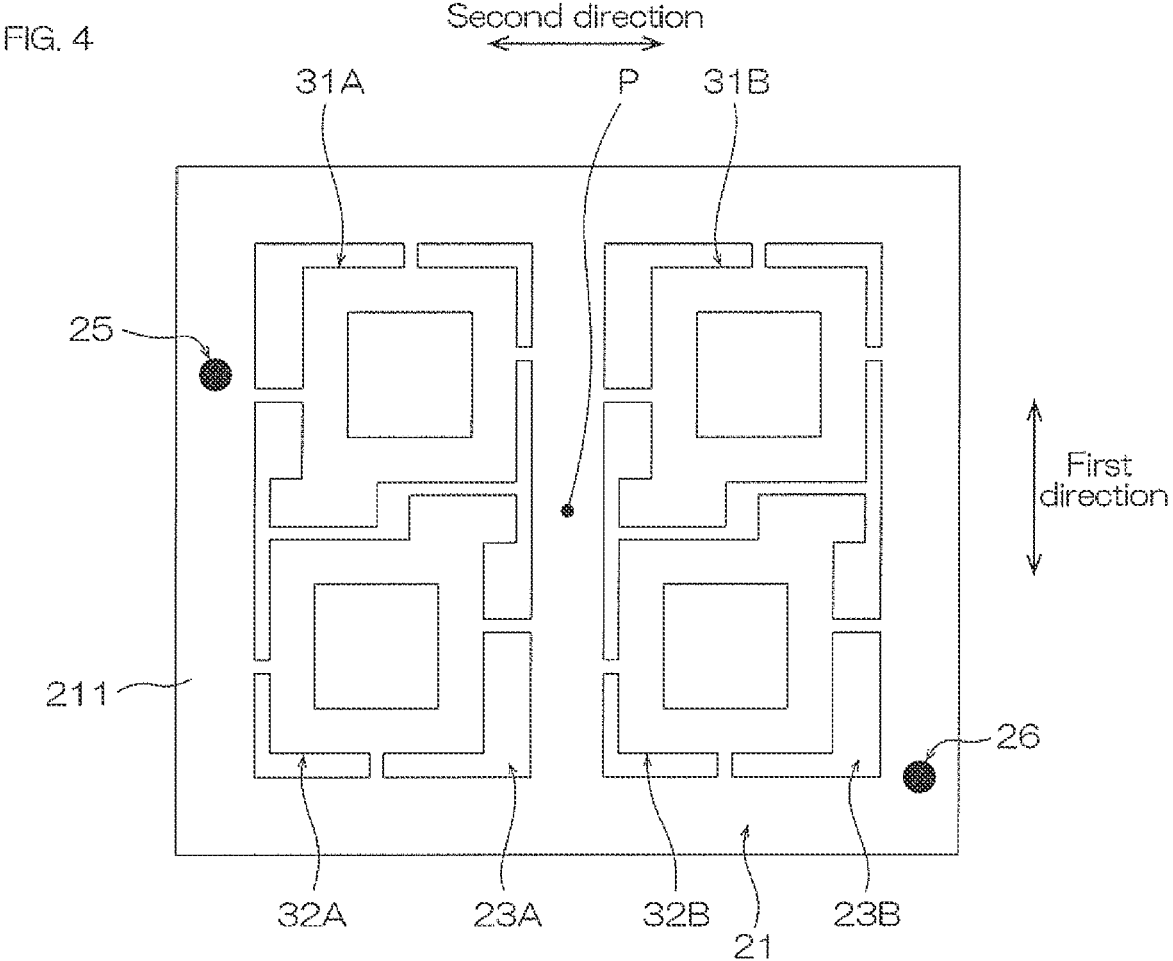
FIG. 4 is a plan view of the assembly sheet of the first variation.

As illustrated in FIG. 4, the second mark 26 is disposed in the other-side part of the second portion 212 in the first direction. In other words, the second mark 26 is disposed in the other-side part of the supporting portion in the arrangement direction. In this variation, the first mark 25 is disposed in the intermediate portion or the other end portion of the one-side part of the first portion 211 in the first direction. The second mark 26 is disposed in the other end portion of the other-side part of the second portion 212 in the first direction. In this manner, the second mark 26 is asymmetrical to the first mark 25 with respect to the point P centered therebetween. The second mark 26 is close to the second wiring circuit board 32B.

Figure 5:
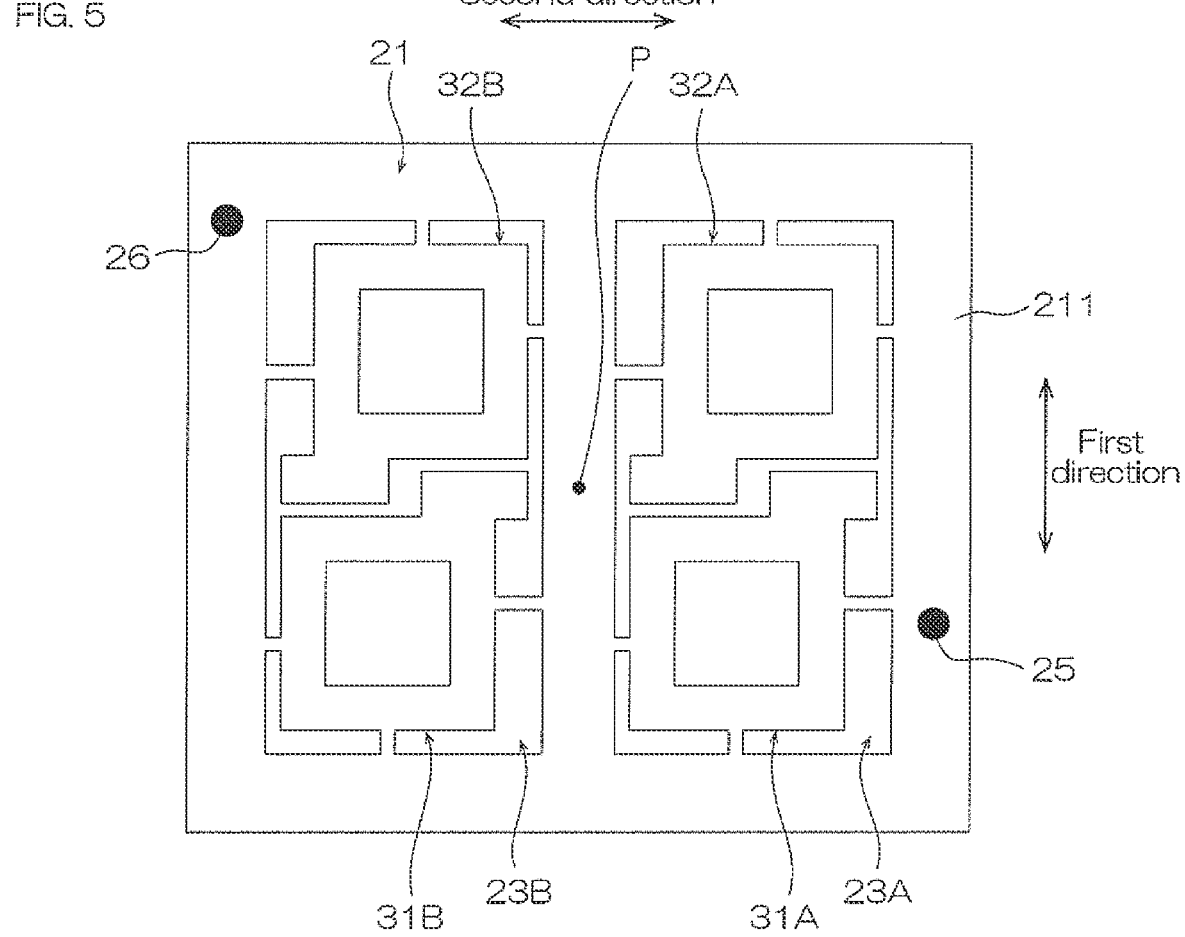
FIG. 5 illustrates a state in which the assembly sheet of FIG. 4 is rotated by 180 degrees.

Also in the first variation, even when the assembly sheet 1 illustrated in FIG. 4 is rotated by 180 degrees as illustrated in FIG. 5, the operator can distinguish the first mark 25 and the second mark 26, which are asymmetrical to each other. This allows the operator to identify the first wiring circuit board 31A adjacent to the first mark 25 and the second wiring circuit board 32B adjacent to the second mark 26. Based on the differentiation of the first wiring circuit board 31A, the operator can identify the second wiring circuit board 32A located in the first region 23A and arranged next to the first wiring circuit board 31A. Based on the differentiation of the second wiring circuit board 32B, the operator can identify the first wiring circuit board 31B located in the second region 23B and arranged next to the first wiring circuit board 31B.

3.2 Second Variation

Figure 6:
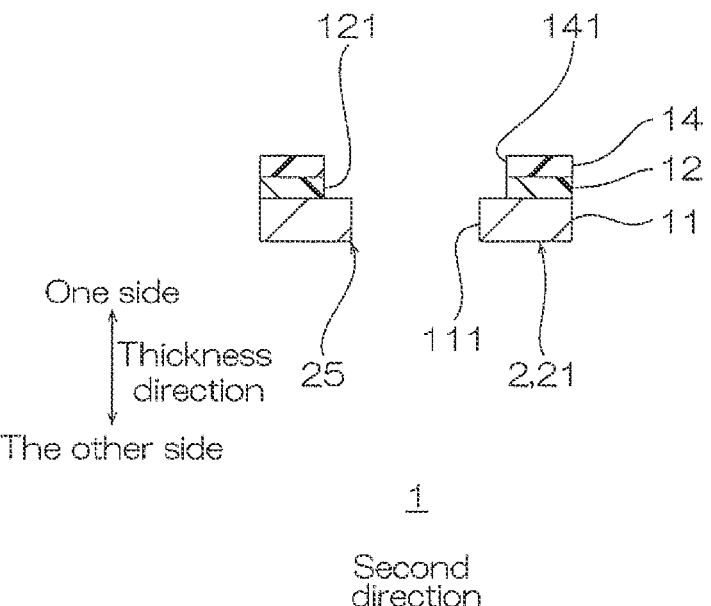
FIG. 6 is a cross-sectional view of the first mark of the second variation.

As illustrated in FIG. 6, the first mark 25 includes the metal penetrating hole 111 included in the metal supporting layer 11.

The first mark 25 can be recognized from either of one side or the other side in the thickness direction.

When the first mark 25 can be recognized from the one side in the thickness direction, each of the base penetrating hole 121 and the cover penetrating hole 141 is larger than the metal penetrating hole 111. The one-side surface of the metal supporting layer 11 exposed from the base penetrating hole 121 and the cover penetrating hole 141 forms the first mark 25.

3.3 Third Variation

Figure 7:
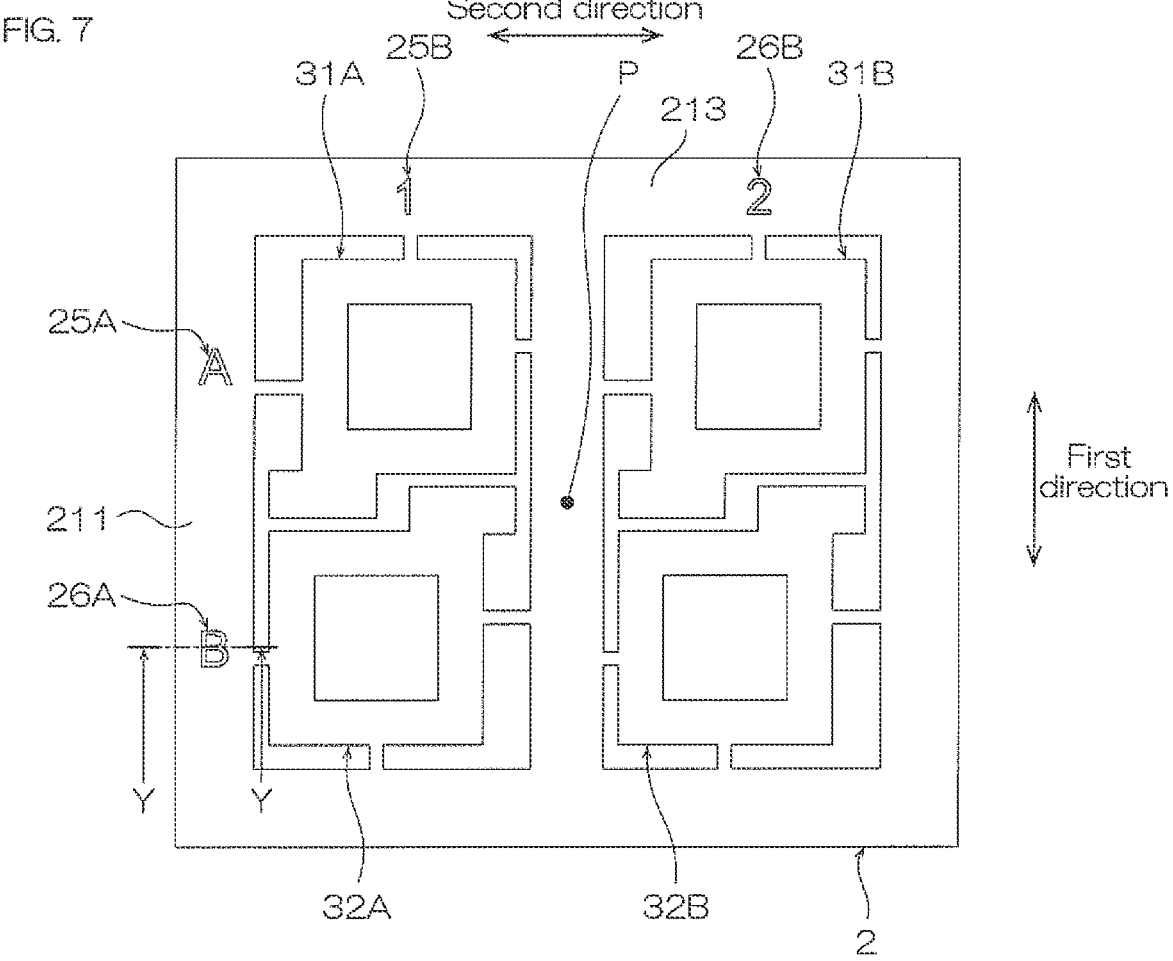
FIG. 7 is a plan view of the assembly sheet of the third variation.

As illustrated in FIG. 7, the supporting portion 2 includes first marks 25A and 25B and second marks 26A and 26B.

3.3.1 First Mark 25A and Second Mark 26A

The first mark 25A and the second mark 26A have asymmetry about the point P. Each of the first mark 25A and the second mark 26A is disposed in the first portion 211.

The first mark 25A is adjacent to the first wiring circuit board 31A. The first mark 25A is disposed at a side opposite to the first wiring circuit board 31B relative to the first wiring circuit board 31A in the second direction.

The second mark 26A is separated from the first mark 25A by an interval in the first direction. The second mark 26A is adjacent to the second wiring circuit board 32A. The second mark 26A is disposed at a side opposite to the second wiring circuit board 32B relative to the second wiring circuit board 32A in the second direction. Each of the first mark 25A and the second mark 26A is a character mark (alphabet mark).

Figure 8:
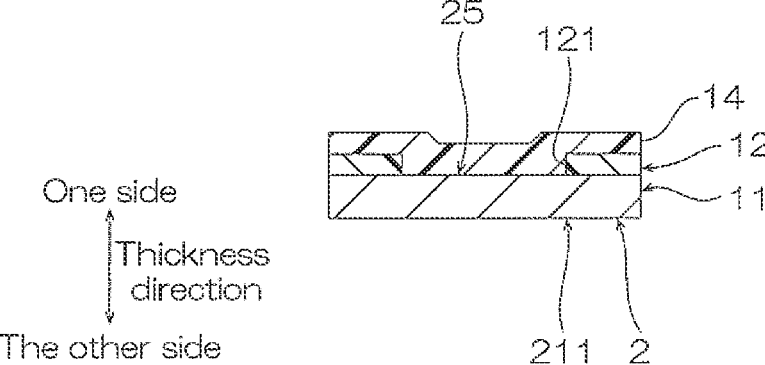
FIG. 8 is a cross-sectional view of the first mark of the assembly sheet of FIG. 7, taken along line Y-Y.

As illustrated in FIG. 8, each of the first mark 25A and the second mark 26A is formed of the one-side surface of the metal supporting layer 11 inside the base penetrating hole 121.

3.3.2 First Mark 25B and Second Mark 26B

As illustrated in FIG. 7, the first mark 25B and the second mark 26B have asymmetry about the point P. Each of the first mark 25B and the second mark 26B is disposed in one of the third portions 213.

The first mark 25B is adjacent to the first wiring circuit board 31A. The first mark 25B is disposed at a side opposite to the second wiring circuit board 32A relative to the first wiring circuit board 31A in the first direction.

The second mark 26B is separated from the first mark 25B by an interval in the second direction. The second mark 26B is adjacent to the first wiring circuit board 31B. The second mark 26B is disposed at a side opposite to the second wiring circuit board 32B relative to the first wiring circuit board 31B in the first direction. Each of the first mark 25B and the second mark 26B is a character mark (number mark).

Each of the first mark 25B and the second mark 26B has the same layer structure as the first mark 25A.

In the third variation, the first marks 25A and 25B are distinguished from the second marks 26A and 26B. As a result, the first wiring circuit boards 31A and 31B are distinguished from the second wiring circuit boards 32A and 32B.

The assembly sheet 1 only needs to include at least two marks that are asymmetrical to each other among the four marks (the first marks 25A and 25B and the second marks 26A and 26B).

3.4 Fourth Variation

Figure 9:
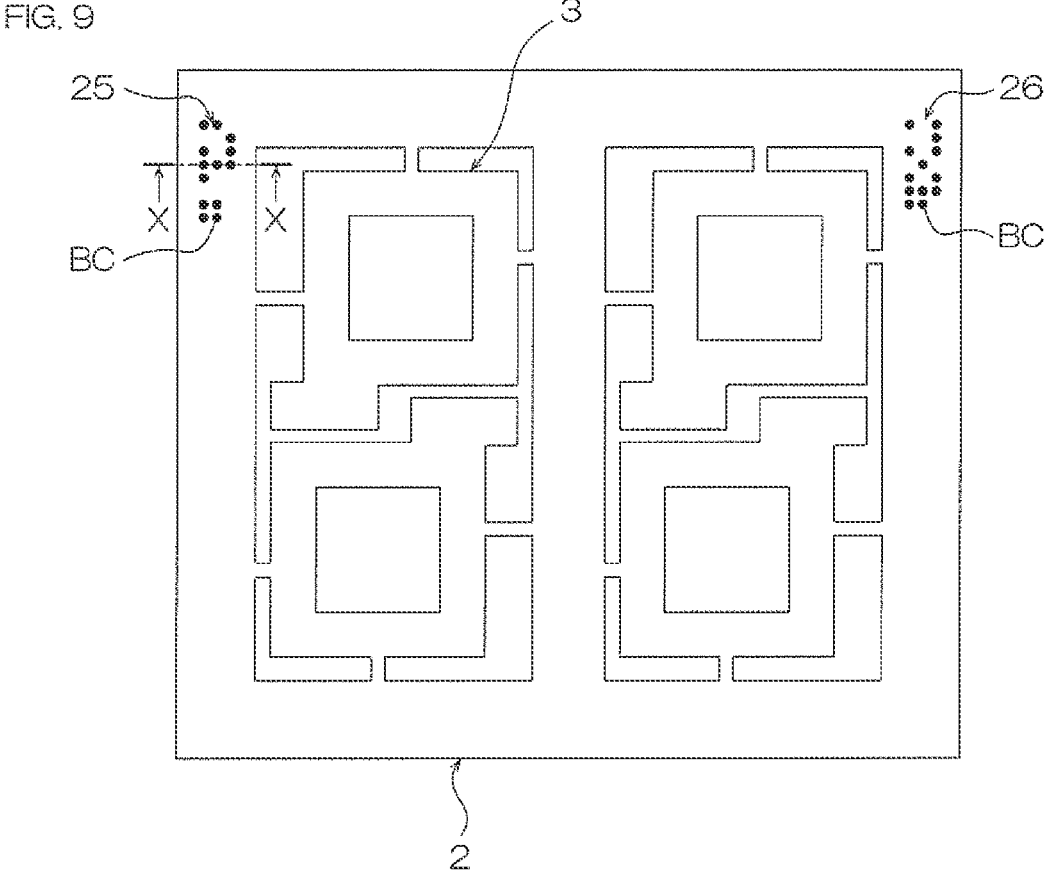
FIG. 9 is a plan view of the assembly sheet of the fourth variation.
Figure 10:
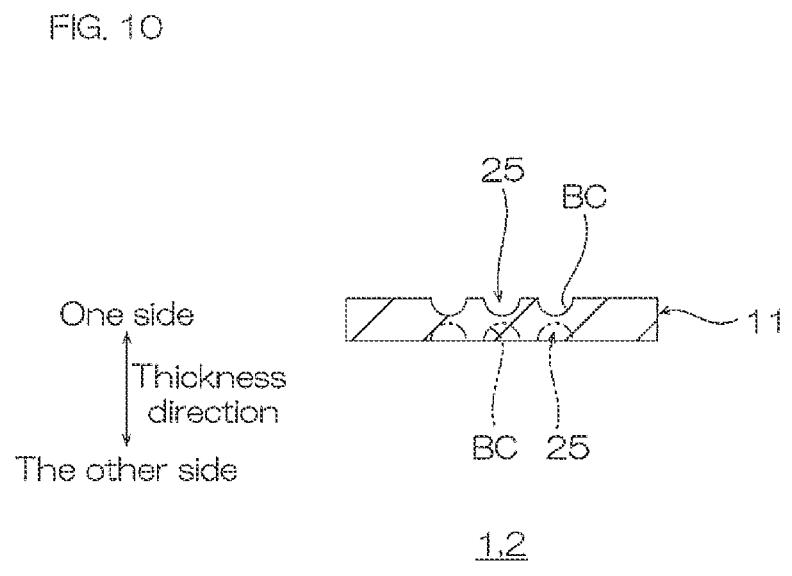

As illustrated in FIG. 9, each of the first mark 25 and the second mark 26 includes a barcode BC. As illustrated with the solid line of FIG. 10, the barcode BC is formed on the one-side surface of the metal supporting layer 11 in the thickness direction. As illustrated with the phantom lines of FIG. 10, the barcode BC may be formed on the other-side surface of the metal supporting layer 11 in the thickness direction.

3.5 Fifth Variation

Figure 11:
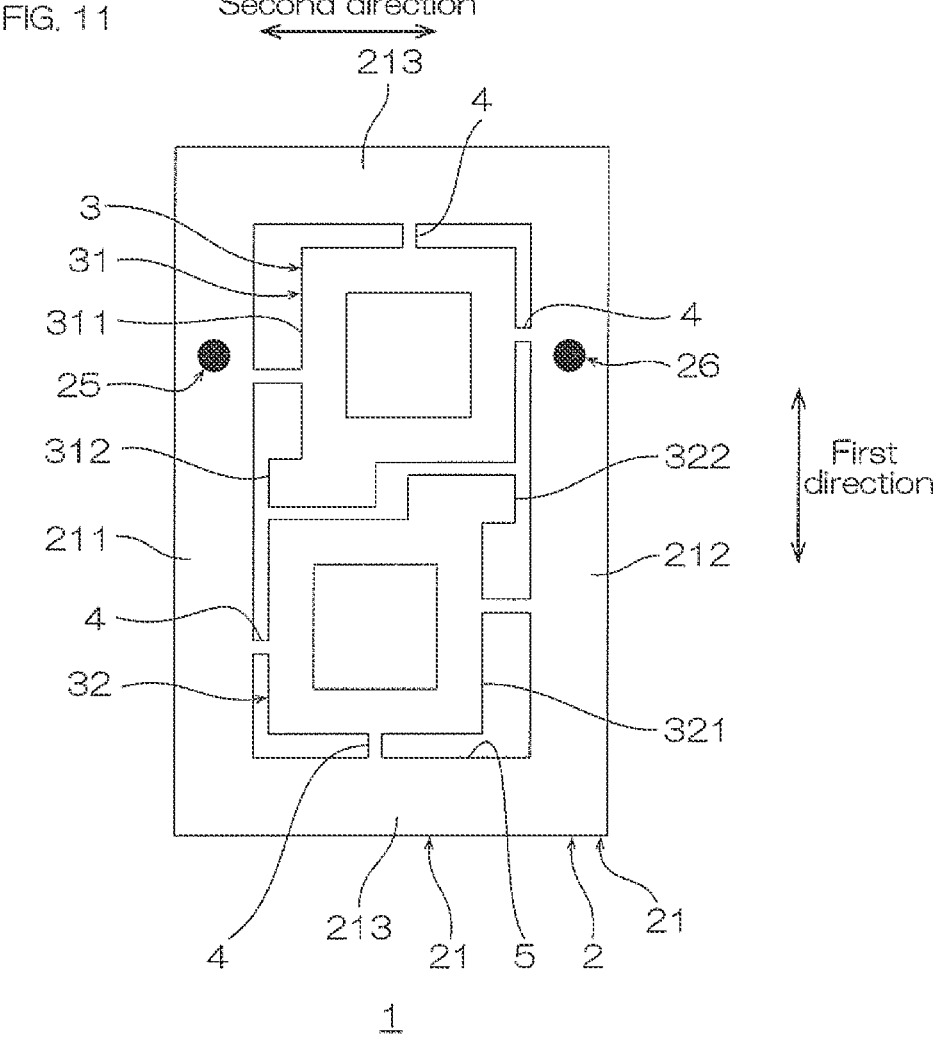
FIG. 11 is a plan view of the assembly sheet of the fifth variation.

As illustrated in FIG. 11, the assembly sheet 1 may include a single first wiring circuit board 31 and a single second wiring circuit board 32.

In the fifth variation, the supporting portion 2 does not include a rail portion 22.

3.6 Sixth Variation

Figure 12:
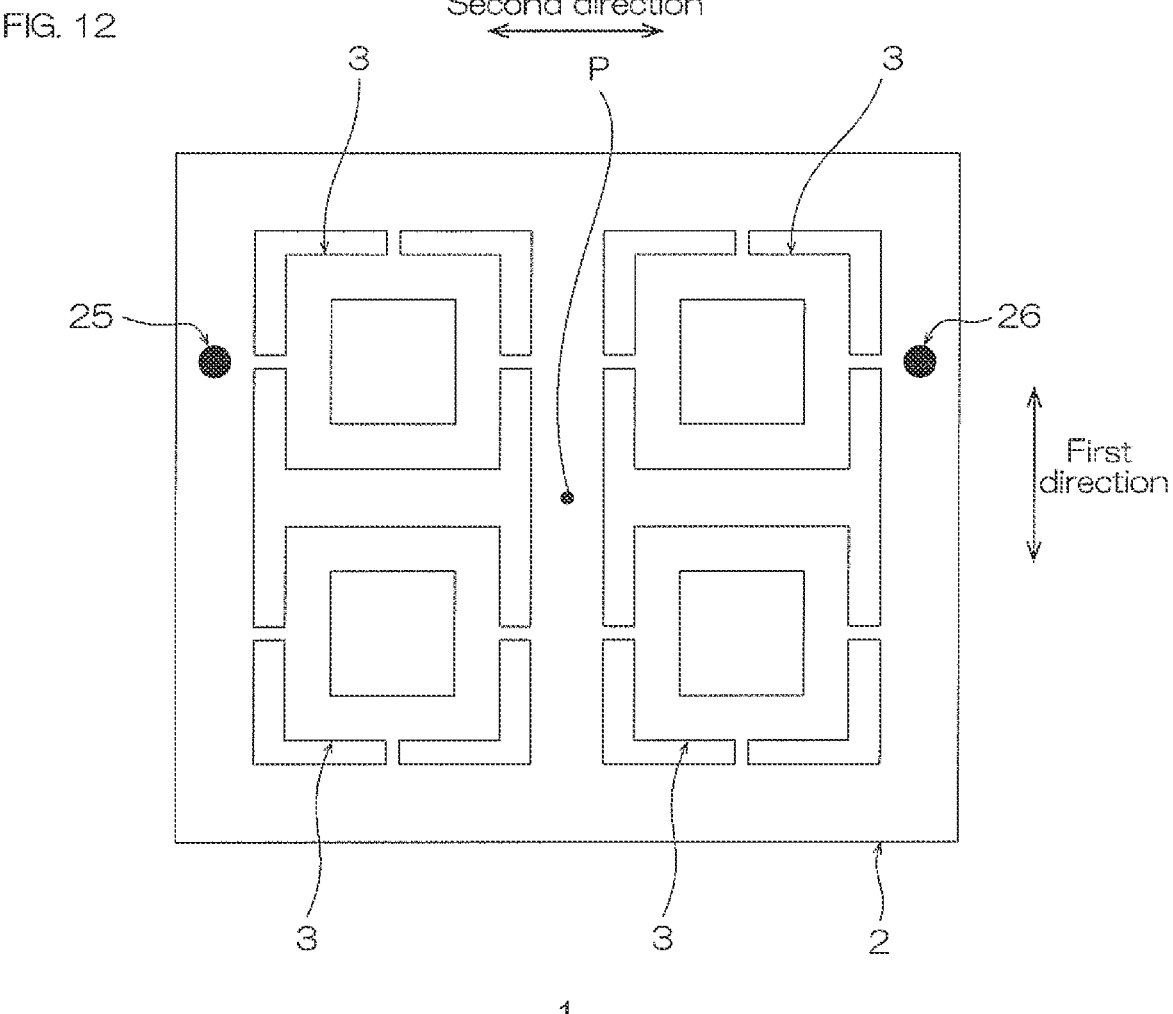
FIG. 12 is a plan view of the assembly sheet of the sixth variation.

As illustrated in FIG. 12, each of the wiring circuit boards 3 may not include a protruding portion. Each of the wiring circuit boards 3 has a rectangular frame shape.

DESCRIPTION OF REFERENCE NUMERALS 1 assembly sheet
2 supporting portion
3 wiring circuit board

4 joint portion
11 metal supporting layer
12 insulating base layer
13 conductive layer
25, 25A, 25B first mark
26, 26A, 26B second mark
31, 31A, 31B first wiring circuit board
32, 32A, 32B second wiring circuit board
111 metal penetrating hole
131 conductive mark
311A, 311B first main body portion
312A, 312B first protruding portion
321A, 321B second main body portion
BC barcode
P point While the illustrative embodiments of the present invention are provided in the above description, such is for illustrative purpose only and it is not to be construed as limiting in any manner. Modification and variation of the present invention that will be obvious to those skilled in the art is to be covered by the following claims.

The invention claimed is:

1. An assembly sheet comprising:
a plurality of wiring circuit boards;
a supporting portion supporting the plurality of wiring circuit boards and surrounding the plurality of wiring circuit boards while being separated from the plurality of wiring circuit boards by an interval; and
a joint portion joining the plurality of wiring circuit boards to the supporting portion,
wherein the plurality of wiring circuit boards includes a first wiring circuit board and a second wiring circuit board arranged adjacent to the first wiring circuit board while being separated from the first wiring circuit board by an interval and being point symmetrical to the first wiring circuit board with respect to a point located between the first wiring circuit board and the second wiring circuit board as a point of symmetry, and
wherein the supporting portion includes a first mark and a second mark being point asymmetrical to the first mark with respect to the point located as the point of symmetry.

2. The assembly sheet according to claim 1,
wherein the first mark is disposed in a one-side part of the supporting portion in an arrangement direction in which the first and second circuit boards are arranged, and wherein the second mark is disposed in the one-side part of the supporting portion in the arrangement direction.

3. The assembly sheet according to claim 1,
wherein the first mark is disposed in a one-side part of the supporting portion in an arrangement direction in which the first and second circuit boards are arranged, and
wherein the second mark is disposed in the other-side part of the supporting portion in the arrangement direction.

4. The assembly sheet according to claim 1,
wherein the first wiring circuit board includes a first main body portion and a first protruding portion protruding from the first main body portion toward the second wiring circuit board,
wherein the second wiring circuit board includes a second main body portion and a second protruding portion protruding from the second main body portion toward the first wiring circuit board, and
wherein the first protruding portion and the second protruding portion are adjacent to each other in a direction intersecting with the thickness direction and an arrangement direction in which the first and second circuit boards are arranged.

5. The assembly sheet according to claim 1,
wherein the supporting portion includes a metal supporting layer, an insulating base layer, and a conductive layer in this order toward one side in the thickness direction, and
wherein each of the first mark and the second mark includes a conductive mark included in the conductive layer.

6. The assembly sheet according to claim 1,
wherein the supporting portion includes a metal supporting layer, and
wherein each of the first mark and the second mark includes a metal penetrating hole included in the metal supporting layer.

7. The assembly sheet according to claim 1,
wherein the supporting portion includes a metal supporting layer, and
wherein each of the first mark and the second mark includes a barcode formed on a one-side surface or the other-side surface of the metal supporting layer in the thickness direction.

* * * * *